(12) United States Patent
Levinson et al.

(10) Patent No.: US 11,874,597 B2
(45) Date of Patent: Jan. 16, 2024

(54) STOCHASTIC OPTICAL PROXIMITY CORRECTIONS

(71) Applicant: Synopsys, Inc., Mountain View, CA (US)

(72) Inventors: Zachary Levinson, Mountain View, CA (US); Yunqiang Zhang, Mountain View, CA (US)

(73) Assignee: Synopsys, Inc., Sunnyvale, CA (US)

( * ) Notice: Subject to any disclaimer, the term of this patent is extended or adjusted under 35 U.S.C. 154(b) by 529 days.

(21) Appl. No.: 17/184,460

(22) Filed: Feb. 24, 2021

(65) Prior Publication Data

US 2021/0263407 A1    Aug. 26, 2021

Related U.S. Application Data

(60) Provisional application No. 62/981,444, filed on Feb. 25, 2020.

(51) Int. Cl.
| | |
|---|---|
| *G03F 1/72* | (2012.01) |
| *G03F 1/84* | (2012.01) |
| *H01L 21/033* | (2006.01) |
| *H01L 21/311* | (2006.01) |

(52) U.S. Cl.
CPC ............ *G03F 1/72* (2013.01); *G03F 1/84* (2013.01); *H01L 21/0337* (2013.01); *H01L 21/31144* (2013.01)

(58) Field of Classification Search
CPC ..... G03F 1/72; G03F 1/84; G03F 1/36; H01L 21/0337; H01L 21/31144
USPC ......................................................... 382/144
See application file for complete search history.

(56) References Cited

U.S. PATENT DOCUMENTS

| | | | |
|---|---|---|---|
| 7,378,202 B2 | 5/2008 | Granik et al. | |
| 8,849,008 B2 | 9/2014 | Zhou et al. | |
| 9,406,573 B2 * | 8/2016 | Abe | ............ G03F 1/22 |
| 9,934,346 B2 | 4/2018 | Hansen | |

(Continued)

FOREIGN PATENT DOCUMENTS

WO    WO-2021062040 A1    4/2021

OTHER PUBLICATIONS

Biafore et al., J. J., "Statistical simulation of resist at EUV and ArF," Proc. SPIE 7273, Advances in Resist Materials and Processing Technology XXVI, SPIE Advanced Lithograph, Apr. 1, 2009, San Jose, CA, 11 pp.

(Continued)

*Primary Examiner* — Neil R McLean
(74) *Attorney, Agent, or Firm* — Weaver Austin Villeneuve & Sampson LLP

(57) ABSTRACT

A method of improving mask data used in fabrication of a semiconductor device includes, in part, setting a threshold value associated with a defect based on stochastic failure rate of the defect, performing a first optimal proximity correction (OPC) of the mask data using nominal values of mask pattern contours, identifying locations within the first OPC mask data where stochastically determined mask pattern contours may lead to the defect, placing check figures on the identified locations to enable measurement of distances between the stochastically determined mask pattern contours, and performing a second OPC of the first OPC mask data so as to cause the measured distances to be greater than the threshold value.

20 Claims, 11 Drawing Sheets

(56) References Cited

U.S. PATENT DOCUMENTS

| | | | |
|---|---|---|---|
| 10,599,046 | B2 | 3/2020 | Kim |
| 11,061,373 | B1* | 7/2021 | Khaira .................. G05B 13/042 |
| 11,079,687 | B2 | 8/2021 | Slachter et al. |
| 11,468,222 | B2 | 10/2022 | Kandel et al. |
| 11,475,201 | B2 | 10/2022 | Stanton et al. |
| 11,640,490 | B2 | 5/2023 | Stanton et al. |
| 2007/0074145 | A1* | 3/2007 | Tanaka ...................... G03F 1/36 716/55 |
| 2018/0150578 | A1* | 5/2018 | Lai ........................... G03F 7/705 |
| 2019/0056651 | A1* | 2/2019 | Verduijn ............. H01L 21/0337 |
| 2021/0018850 | A1 | 1/2021 | Slachter et al. |
| 2021/0263404 | A1 | 8/2021 | Kandel et al. |
| 2021/0263405 | A1 | 8/2021 | Stanton et al. |
| 2021/0264091 | A1 | 8/2021 | Stanton et al. |

OTHER PUBLICATIONS

De Bisschop et al., P., "Stochastic Printing Failures in EUV Lithography," Proc. SPIE 10957, Extreme Ultraviolet (EUV) Lithography X, SPIE Advanced Lithography, Mar. 26, 2019, San Jose, CA, 21 pp.

Ex Parte Quayle Action dated Mar. 28, 2022 issued in U.S. Appl. No. 17/182,135.

Jonckheere, R., et al., "Stochastic printing behavior of ML-defects on EUV mask," Proc. SPIE 11147, Int'l Conference on Extreme Ultraviolet Lithography, Oct. 24, 2019, SPIE Photomask Technology + EUV Lithography, Monterey, CA, 14 pp.

Kim et al., S.-M., "Understanding of stochastic noise," Proc. SPIE 9422, Extreme Ultraviolet (EUV) Lithography VI, SPIE Advanced Lithography, Apr. 7, 2015, San Jose, CA, 12 pp.

Lucas, K., et al., "Exploration of compact and rigorous simulation-based methods to reduce stochastic failure risk," EUV Workshop, 2019 Synopsys, Inc., 23 pp.

Maslow, M. J., et al., "Impact of Local Variability on Defect-Aware Process Windows," Proc. SPIE 10957, Extreme Ultraviolet (EUV) Lithography X, SPIE Advanced Lithography, Mar. 26, 2019, San Jose, CA, 16 pp.

P. De Bisschop, "Stochastic effects in EUV lithography: random, local CD variability, and printing failures," J. Micro/Nanolithography, MEMS, MOEMS, vol. 16, No. 4, p. 041013-1-041013-17, Oct.-Dec. 2017.

U.S. Notice of Allowance dated Jun. 9, 2022 in U.S. Appl. No. 17/182,135.

U.S. Supplementary Notice of Allowance dated Sep. 14, 2022 in U.S. Appl. No. 17/182,135.

U.S. Supplementary Notice of Allowance dated Sep. 14, 2022 in U.S. Appl. No. 17/183,291.

U.S Advisory Action dated Aug. 25, 2022 in U.S. Appl. No. 17/184,521.

U.S. Final office Action dated Jun. 17, 2022 in U.S. Appl. No. 17/184,521.

U.S. Notice of Allowance dated Dec. 19, 2022 in U.S. Appl. No. 17/184,521.

U.S. Notice of Allowance dated Jun. 29, 2022 in U.S. Appl. No. 17/183,291.

U.S. Notice of Allowance dated Mar. 16, 2022 issued in U.S. Appl. No. 17/183,291.

U.S. Office Action dated Feb. 1, 2022 issued in U.S. Appl. No. 17/184,521.

U.S. Office Action dated Sep. 28, 2021 issued in U.S. Appl. No. 17/183,291.

Wintz et al., D. T., "Photon flux requirements for extreme ultraviolet reticle imaging in the 22- and 16-nm nodes," J. Micro/Nanolith. MEMS MOEMS vol. 9, No. 4, Oct.-Dec. 2010, 8 pp.

\* cited by examiner

US 11,874,597 B2

STOCHASTIC OPTICAL PROXIMITY CORRECTIONS

RELATED APPLICATION

The present application claims benefit under 35 USC 119(e) of U.S. Application Ser. No. 62/981,444, filed Feb. 25, 2020, the content of which is incorporated herein by reference in its entirety.

TECHNICAL FIELD

The present disclosure relates to masks used during the fabrication of semiconductor devices, and more particularly to using a stochastic model to optimize such masks.

BACKGROUND

A microlithography process in semiconductor integrated circuit manufacturing process involves transferring a mask pattern on to a photoresist film disposed on a wafer. The quality of the resulting pattern on the wafer depends on the uniformity of photon absorption that the photoresist film receives during exposure, as well as the uniformity of the subsequent photo-chemical reactions in the exposed photoresist film. Photon statistics have become increasingly important as the brightness of the illumination source decreases.

Extreme Ultraviolet (EUV) lithography scanner systems used in feature sizes that are smaller than 20 nm have a number of shortcoming such as low source brightness and low source throughput. Such shortcomings lead to photon shot noise which has an adverse effect on the image processing development.

BRIEF SUMMARY

A method of improving mask data used in fabrication of a semiconductor device, in accordance with one embodiment of the present disclosure includes, in part, setting a threshold value associated with a defect based on stochastic failure rate of the defect, performing a first optimal proximity correction (OPC) of the mask data using nominal values of mask pattern contours, identifying locations within the first OPC mask data where stochastically determined mask pattern contours may lead to the defect, placing check figures on the identified locations to enable measurement of distances between the stochastically determined mask pattern contours, and performing a second OPC of the first OPC mask data so as to cause the measured distances to be greater than the threshold value.

A method of improving mask data used in fabrication of a semiconductor device, in accordance with one embodiment of the present disclosure includes, in part, defining a cost function associated with a defect based on stochastic failure rate of the defect, performing a first inverse lithography technique (ILT) optimization of the mask data using nominal values of mask pattern contours, performing a second ILT optimization of the first ILT optimized mask data using stochastic values of mask pattern contour until a first value of the cost function is less than or equal to a first target value; Manhattanizing the mask pattern contours of the second ILT optimized mask data; and performing a Manhattan optimization of the Manhattanized mask pattern contours until a second value of the cost function is less than or equal to a second target value.

BRIEF DESCRIPTION OF DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

The relatively low photon count of the EUV lithography systems increases the stochastic process variations occurring subsequent to EUV photon absorption. Such processes cause, for example, a printed edge to move away from its expected position with a relatively large probability, thereby resulting in randomly missing or unusable structures. Monte Carlo simulations may be used to provide accurate simulations of the statistical variations for a relatively small area on the mask. However, Monte Carlo simulations are computationally intensive and not practical for use in a full chip.

In accordance with one embodiment of the present disclosure, edge position variations are predicted at a full-chip scale stochastically using a probability distribution function. Stochastic edge position predictions are then used in optical proximity correction (OPC) and/or inverse lithography technology (ILT) to optimize mask pattern data. This is achieved by treating stochastic variation as a parameter in the process window analysis. By taking stochastic variations of edge positions into account during optimization of a mask, embodiments of the present disclosure achieve reduced rates of failure in defects, such as bridge defects or pinch defects. Accordingly, embodiments of the present disclosure result in significantly higher wafer yield and reduced manufacturing cost.

Figures 1A, 1B:
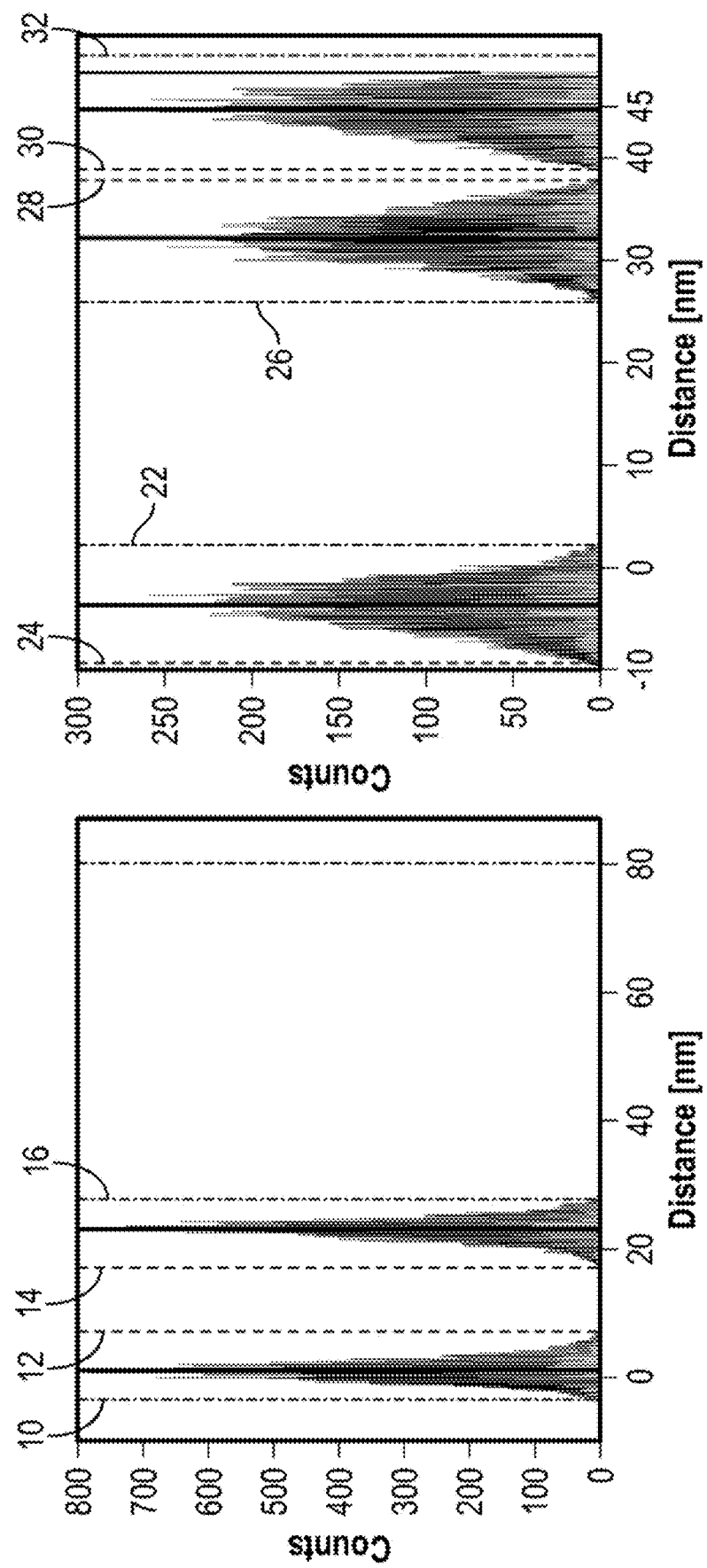
FIG. 1A shows an exemplary edge distribution in a mask pattern that is not prone to stochastic failure.
FIG. 1B shows an exemplary edge distribution in a mask pattern that is prone to stochastic failure.

A small stochastic variance may be characterized as a line edge roughness (LER) and is unlikely to cause failure. When the variance is larger however, or when edges are closer together, failures due to edge variation becomes more likely. FIG. 1A shows the edge distributions and ±3σ (3 standard deviations) edge locations for a pattern that is not prone to stochastic failure. The ±3σ edges 10, 12 are associated with the edge centered (i.e., zero σ) at a distance of 0 nm, and the ±3σ edges 14, 16 are associated with the edge centered at an offset distance of 20 nm.

FIG. 1B shows the edge distributions and ±3σ edge locations for a pattern that is prone to stochastic failure. The ±3σ edges 22, 24 are associated with the edge centered (i.e., zero a) at an offset distance of −5 nm; the ±3σ edges 26, 28 are associated with the edge centered at an offset distance of 30 nm, and the ±3σ edges 30, 32 are associated with the edge centered at an offset distance of 45 nm. Comparing the distributions shown in FIG. 1A to those shown in FIG. 1B, it is seen that the edges in FIG. 1B have wider distributions resulting in their increased stochastic failure.

It is understood that ±3σ edge positions, also referred to herein as ±3σ edges, refer to positions that are ±3 standard deviations away from a nominal (mean) edge position in a Gaussian distribution. It is also understood that while reference is made herein to ±3σ edges, embodiments of the present disclosure are not so limited and may use, for example, ±4σ edges or any other standard deviation away from a nominal edge. It is also understood that embodiments of the present disclosure may use any probability distribution function to determine a probabilistic edge position, Gaussian or otherwise.

Figures 2A, 2B:
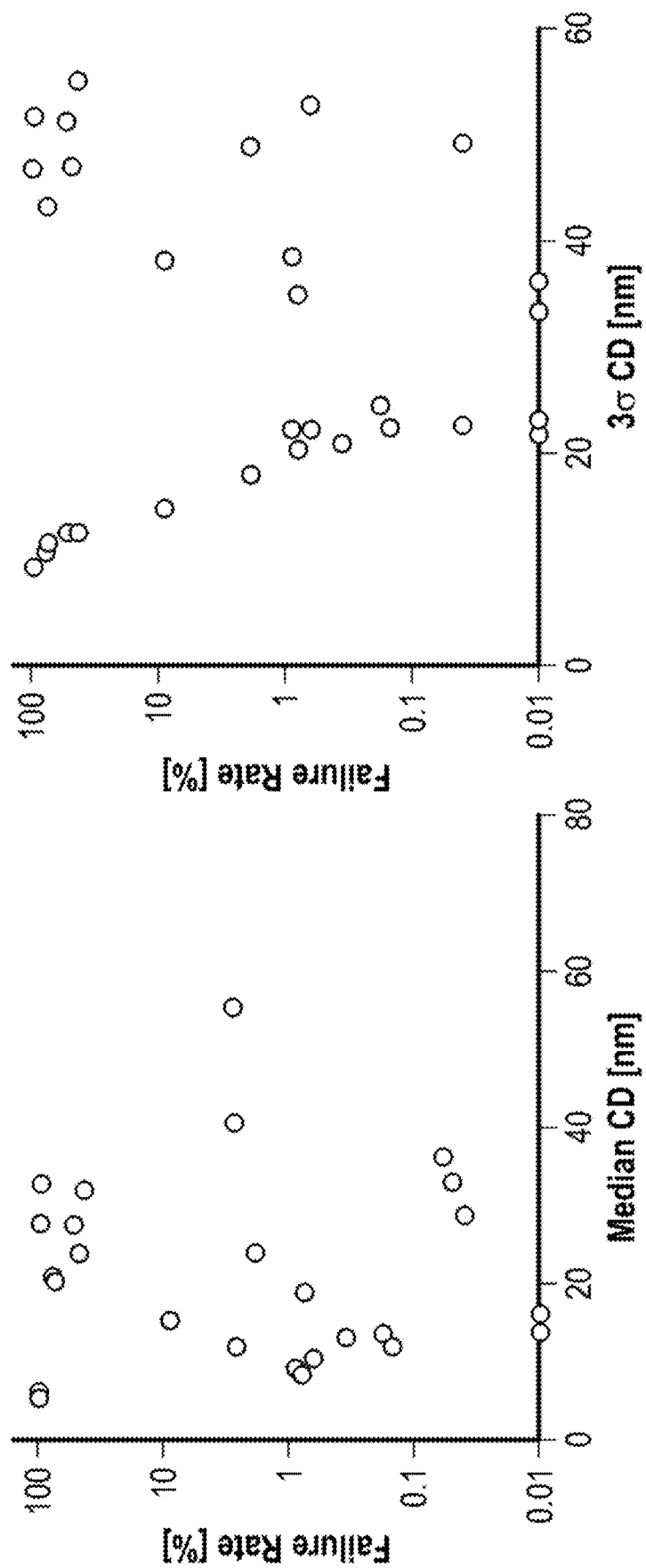
FIG. 2A shows an exemplary failure rate as a function of the median CD of printed features.
FIG. 2B shows an exemplary failure rate as a function of the 3-standard deviations of the CD of printed features.

FIG. 2A shows an exemplary failure rate, as determined by a rigorous simulation model, as a function of the median critical dimension (CD) of printed features. The CD of a feature is understood to refer to the width of the feature at a given location and may be measured by a scanning electron microscope (SEM). FIG. 2B shows an exemplary failure rate, as determined by a rigorous simulation model, as a function of the 3σ CD of printed features.

Figure 3:
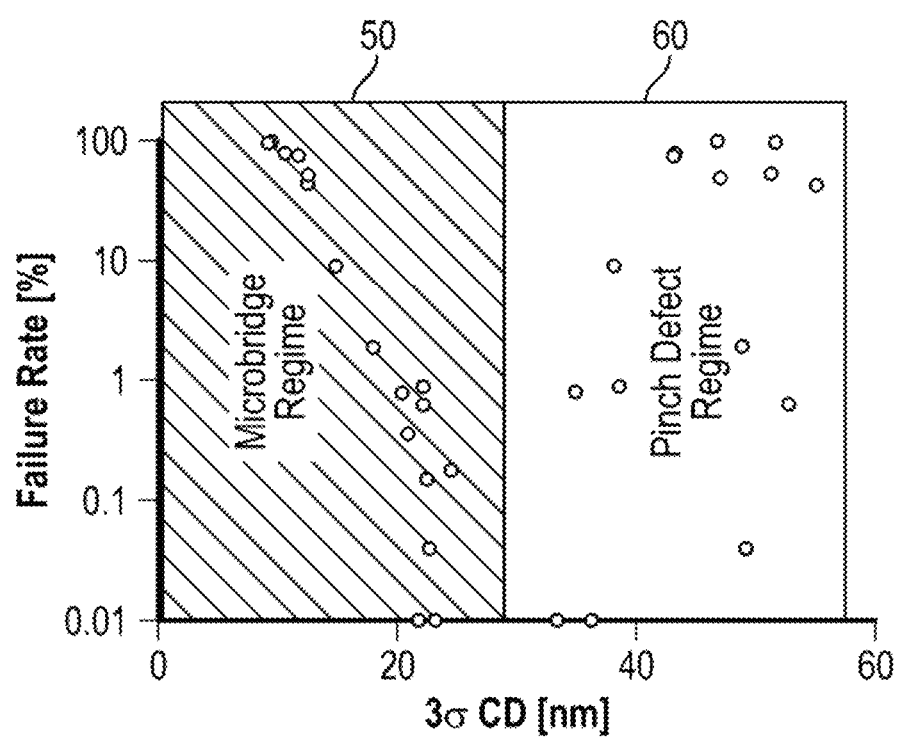
FIG. 3 shows the same data of FIG. 2B depicted in two regimes.

FIG. 3 shows the same data as that shown in FIG. 2B except that in FIG. 3 the data is shown in two distinct regimes. The first regime 50 shows decreasing failure rate with increasing 3σ CD and corresponds to microbridge defects. The second regime 60 that corresponds to pinch defects has an increasing failure rate up to nearly 3σ CD of 40 nm, and a decreasing failure rate beyond the 3σ CD of nearly 40 nm.

Figure 4A:
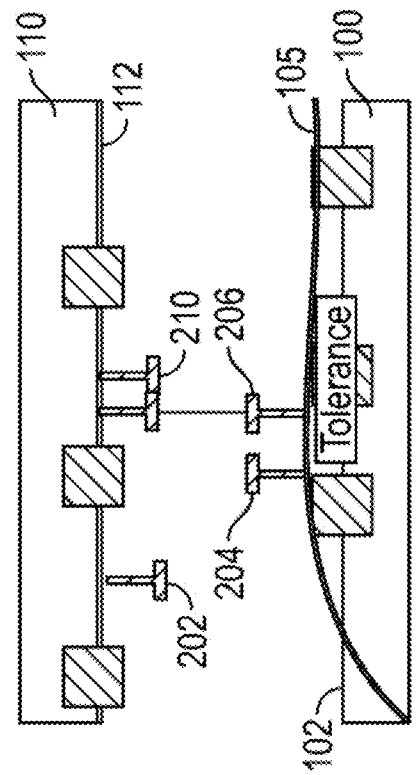
FIG. 4A shows the contours of a pair of exemplary mask patterns.

FIG. 4A shows a pair of exemplary mask patterns 70 and 80. Contours 72, 74 and 76 of mask pattern 70 are shown as appearing along the contours of curved line 75 when transferred to a wafer. Contours 90 of mask pattern 70 is shown as appearing along the contours of curved line 95 when transferred to a wafer. Similarly, contour 82 of mask pattern 80 is shown as appearing along the contours of curved line 85 when transferred to a wafer. Contour 85 and 95 are shown as being closest to one another at the position denoted by arrow 88 at which position the distance between the two contours is shown as d. When distance d is less than a critical dimension, contour lines 85 and 95 may come into contact thereby causing a bride defect. Similarly, if the shortest distance between contour lines 75 and 85, shown at the position denoted by arrow 98, is smaller than a critical dimension, contour lines 85 and 95 may come into contact thereby causing a pinch defect. To determine the distances that cause pinch or bridge defects, in one embodiment check figures are used.

Figure 4B:
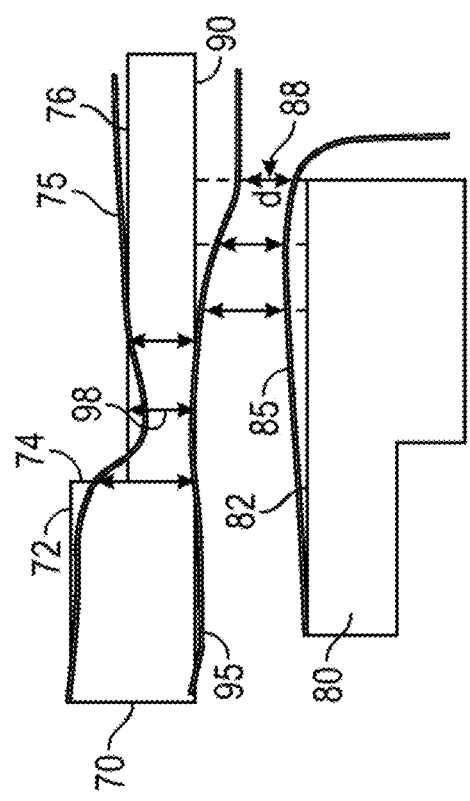
FIG. 4B shows the contours of a pair of exemplary mask patterns.

FIG. 4B shows a pair of mask patterns 100 and 110. Edges (also referred to herein as contours) 102 of mask pattern 100 is shown as appearing along the contours of curved line 105 when transferred to a wafer. T-shaped check figure 202 and π-shaped check figure 210 are shown as having been placed along contour 112 of pattern 110. Similarly, T-shaped check figures 204 and 206 are shown as having been placed along positions where the contours of line 105 may form. The check figures are used to measure the distances that can lead to pinch or bridge defects.

Figure 5:
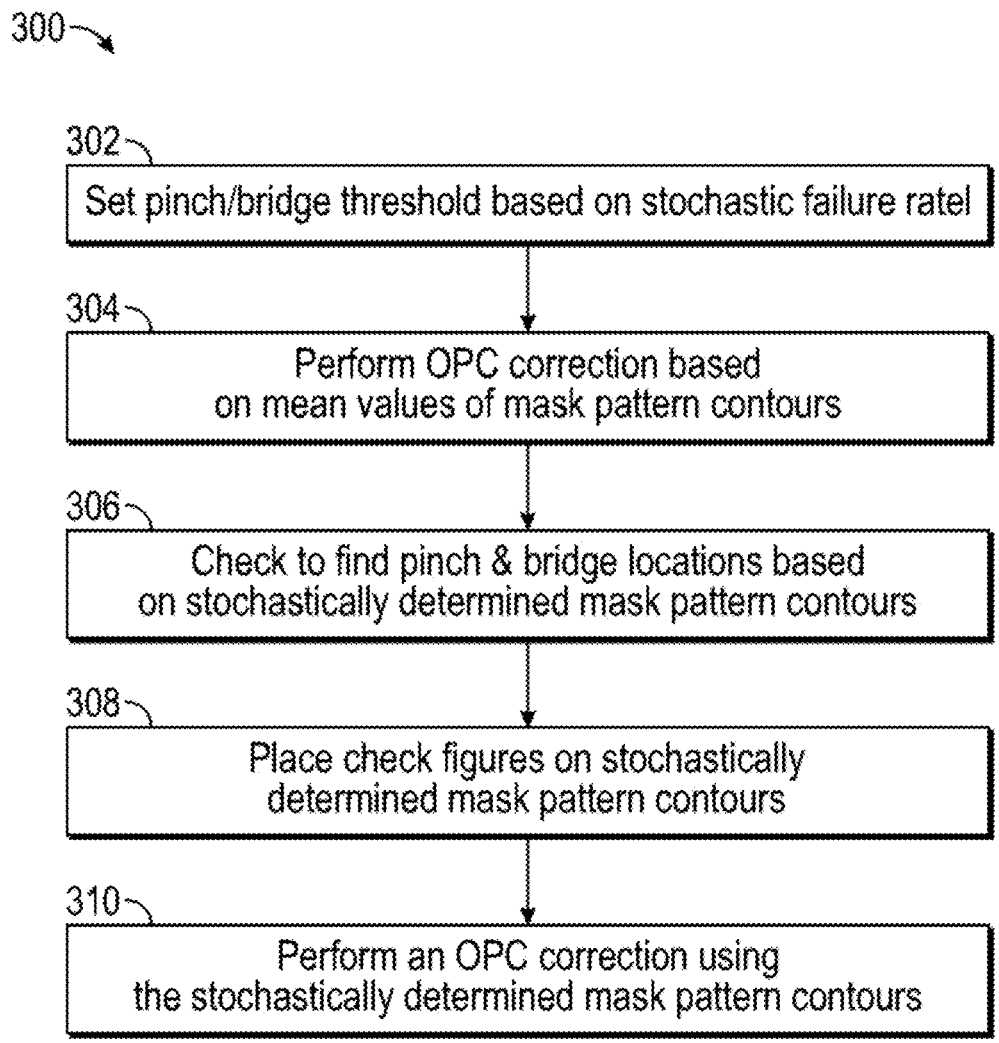
FIG. 5 shows a flowchart for optimizing mask data, in accordance with one embodiment of the present disclosure.

FIG. 5 shows a flowchart 300 for optimizing mask data, in accordance with one embodiment of the present disclosure. At 302, based on previously analyzed failure rate data, threshold values for both pinch and bridge defects are set. For example, referring to and based on the data shown in FIG. 3A, the threshold value for bridge defects may be set to, e.g., 15 nm, and the threshold value for pinch defects may be set to, e.g., 40 nm. At 304, an OPC of the mask data is performed based on the nominal values of the pattern edges.

At 306, the OPC corrected mask data is analyzed to identify locations where pattern edges (also referred to herein as contours), as determined stochastically, may lead to pinch or bridge defects. For example, in one embodiment, the 3σ edge values are used in making such determinations. Accordingly, in such embodiments, if the distance between the 3σ value of a first edge and the 3σ value of a second edge is determined to be greater than a predefined value, the two edges are considered as unlikely to result in pinch or defect bridges. If, however, in such embodiments, the distance between the 3σ value of a first edge and the 3σ value of a second edge is determined to be equal to or less than the predefined value, the two edges are considered as likely to result in pinch or defect bridges. It is understood that any other stochastic model may be used to determine the stochastic edge positions of a mask patterns.

At 308, check figures are placed at locations where the difference between stochastic edge positions, as determined at 306, is equal to or less than the predefined value. At 310, an OPC is performed based on the stochastic data determined at 306 and check figures placed at 308. Accordingly, if for example, the stochastic positions (e.g., 3σ values) of a pair of edges are determined to be equal to or less than the predefined value, as identified by the placement of corresponding check figures, at 310 the OPC may move one or both edges so as to prevent failure due to pinching or bridging effect.

Figure 6A:
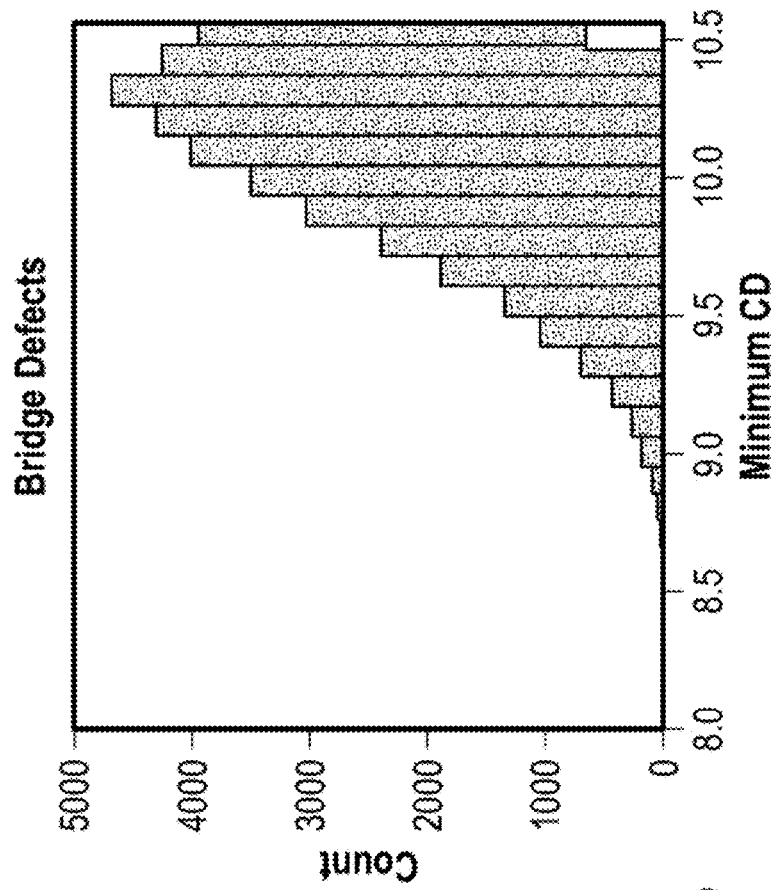
FIG. 6A shows an exemplary histogram of the number of pinch defects as a function of minimum CD obtained both using mask data corrected using a conventional OPC model, and an OPC model that accounts for stochastic variations in accordance with embodiments of the present disclosure.

FIG. 6A shows an exemplary histogram of the number of pinch defects as a function of minimum CD obtained using mask data corrected using a (i) conventional OPC model, and (ii) an OPC model that accounts for stochastic variations, in accordance with embodiments of the present disclosure. The shaded bars show the pinch defect counts as obtained from a conventional OPC model, and the white bars show the pinch defect counts as obtained from an OPC model that performs stochastic correction in accordance with one embodiment of the present disclosure. FIG. 6A shows that for CDs less than nearly 10.7 nm, embodiments of the present disclosure result in significantly fewer pinch defects.

Figure 6B:
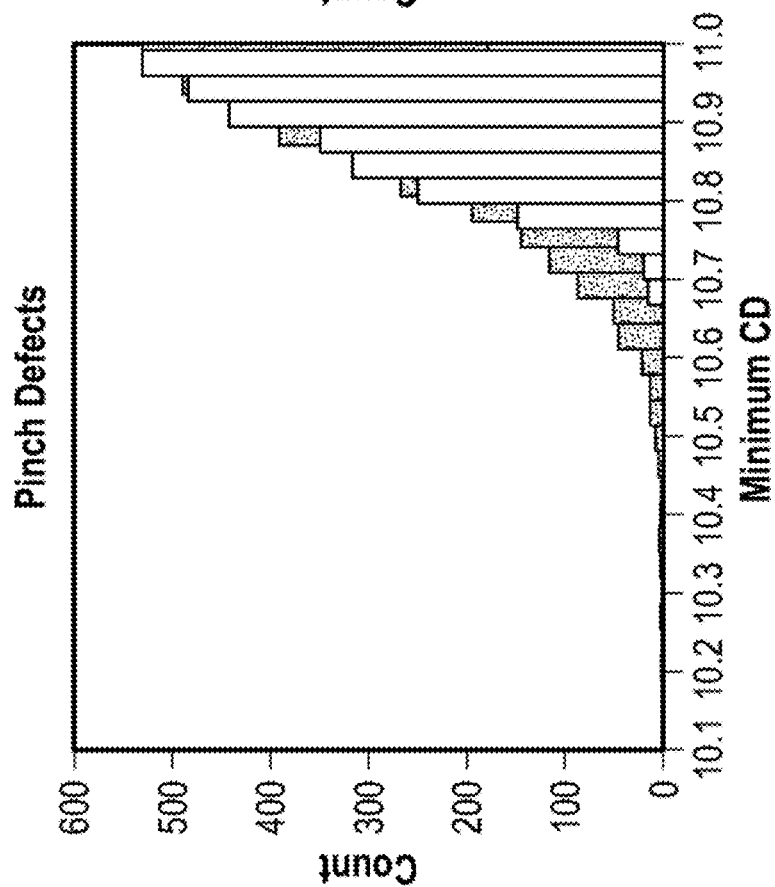
FIG. 6B shows an exemplary histogram of the number of bridge defects as a function of minimum CD obtained both using mask data corrected using a conventional OPC model, and an OPC model that accounts for stochastic variations in accordance with embodiments of the present disclosure.

FIG. 6B shows an exemplary histogram of the number of bridge defects as a function of minimum CD obtained using mask data corrected using a (i) conventional OPC model, and (ii) an OPC model that corrects for stochastic variations in accordance with one embodiment of the present disclosure. The shaded bars show the bridge defect counts as obtained from a conventional OPC model, and the white bars show the bridge defect counts as obtained from an OPC model that corrects for stochastic variations, in accordance with one embodiment of the present disclosure. As seen from FIG. 6B, at minimum CDs of smaller than 10.5 nm, embodiments of the present disclosure result in nearly no bridge defects. For the data shown in FIG. 6B, embodiments of the present disclosure achieve a 97% reduction in the number of bridge defects relative to a conventional OPC.

Figure 7:
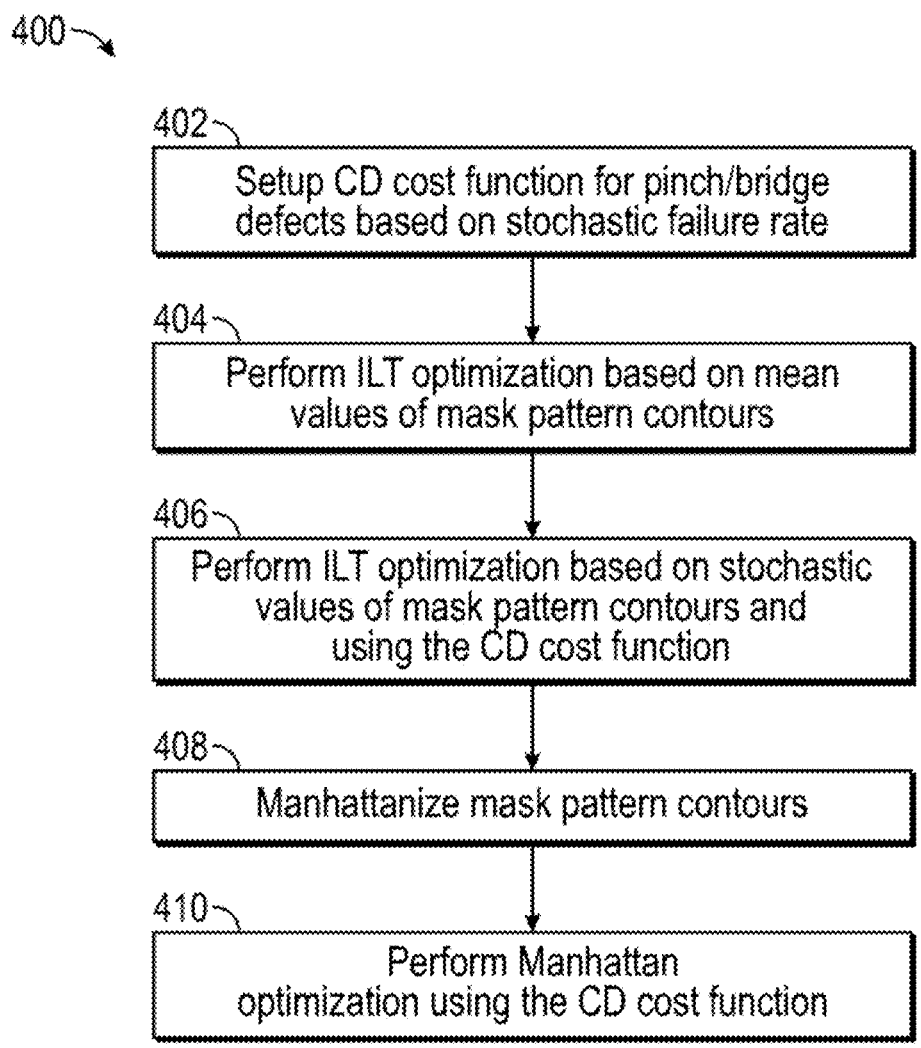
FIG. 7 shows a flowchart for optimizing mask data, in accordance with one embodiment of the present disclosure.

FIG. 7 shows a flowchart 400 for optimizing mask data, in accordance with another embodiment of the present disclosure. At 402, based on previously analyzed failure rate for pinch and bridge defects, such as that shown in FIG. 3, a cost function is set up. The cost function accounts for stochastic values of the mask edges and is referred to herein as a stochastic-aware cost function.

At 404, a first inverse lithograph technology (ILT) optimization is performed based on the nominal (i.e., mean) values of the pattern edges. Next, at 406, a second ILT optimization is performed based on the stochastic values of the pattern edges. In one embodiment, 3σ edge values are used as stochastic values of the pattern edges. It is understood, however, that any other stochastic model may be used to determine the stochastic edge positions of mask patterns. The optimization at 406 continues until the cost function value falls below a target/threshold value.

At 408, the mask pattern data obtained from 406 is Manhattanized so as to convert the mask patterns into edges with angles defined by a relatively small set of angles. For example, in one embodiment, all pattern edges may occur only at either 0° or 90°. To account for errors that occur as a result of the Manhattanization of the mask pattern edge, the Manhattanized mask data is further optimized at 410 using the stochastic-aware cost function. The Manhattan optimization at 406 continues until the cost function value falls below a target or threshold value.

An ILT optimization treats the design of mask patterns as an inverse problem, and then solving the inverse problem to find the optimal mask design using a rigorous mathematical approach. In other words, the ILT seeks to find the optimal mask pattern to print a given target pattern on a wafer, given the known transformation from mask to wafer. Assume that the mask function, the target pattern and the wafer pattern are respectively represented using φ, Ø, and ω. Assume that a forward operator, defined further below, is represented as f. The forward operator may take in to account the elements of the transformation from mask to wafer, such as the electromagnetics of the 3D mask, the optics of illumination and the lens, the behavior of the photoresist, the dose and focus conditions, aberrations, and the like. Therefore, $$\omega = f(\psi) \quad (1)$$

An ILT optimization seeks to find:

$$\varphi^* = f^{-1}(\emptyset) \quad (2)$$

where φ* represents the optimal mask function.

The problems in equation (2) is ill-defined as it could lead to many different mask patterns that could yield identical results on a wafer. To remedy this, the inverse problem is recast as an optimization problem. The goal is then to use a merit function, such as a cost function (CF). The optimization then seeks to lower the cost function, defined below:

$$CF = \iint |f(\psi) - \emptyset|$$

The cost function is the absolute value of the difference between the wafer image and the target pattern, integrated over the area of the mask.

Figure 8:
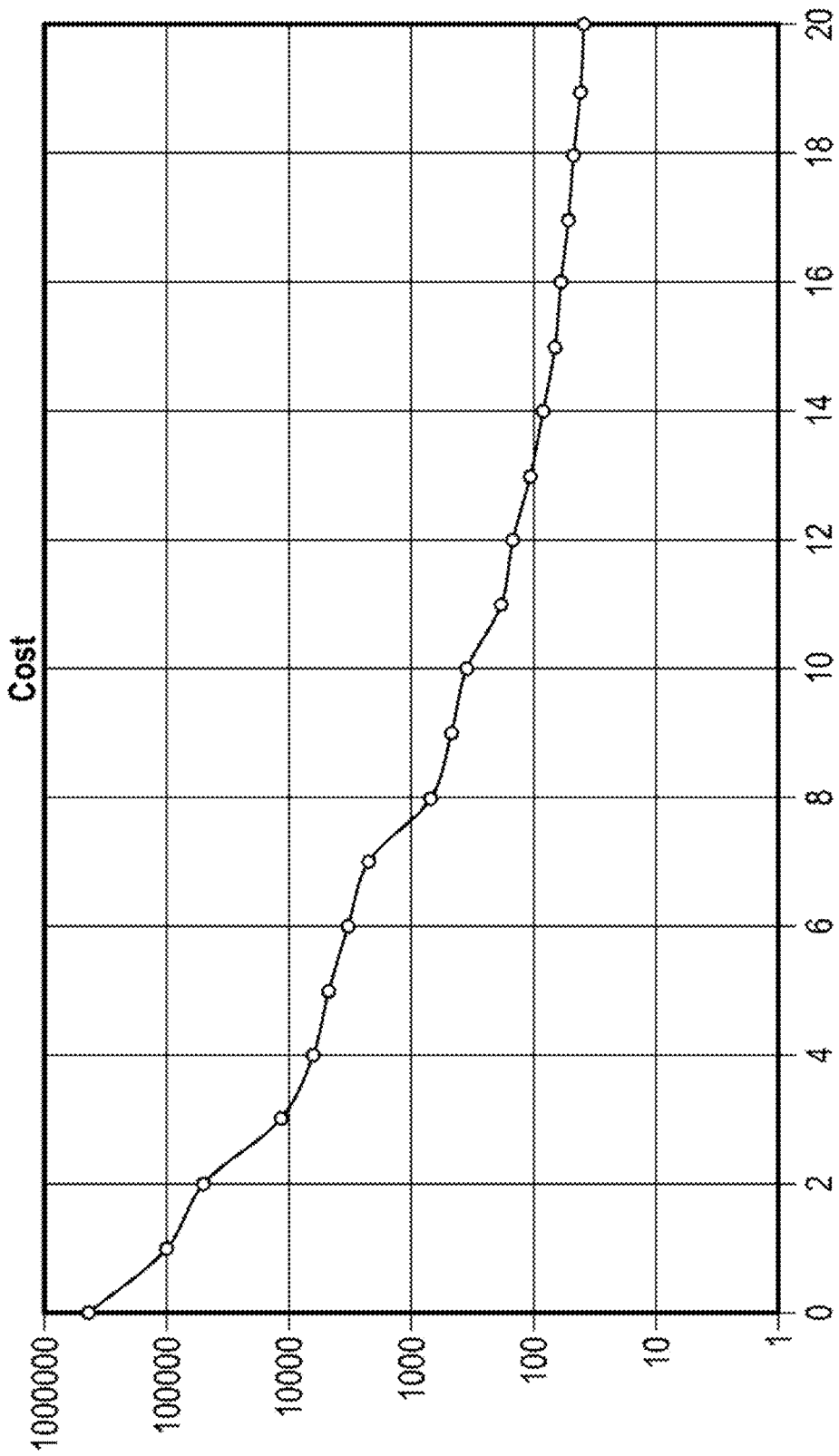
FIG. 8 shows an exemplary cost function value depicted as decreasing with each optimization iteration.

Manufacturing a mask that has patterns with many different angles poses many challenges. To overcome these challenges, the rounded mask patterns are converted into patterns have 90° of 0° angles, in a process referred to as Manhattanization. During a Manhattan optimization, attempt is made to recover the mask quality lost during the Manhattanization. FIG. 8 shows an exemplary cost function depicted as decreasing with each new optimization iteration. As described above, a cost function is used during ILT or Manhattan optimization of pinch or bridge defects, in accordance with embodiments of the present disclosure.

Figure 9B:
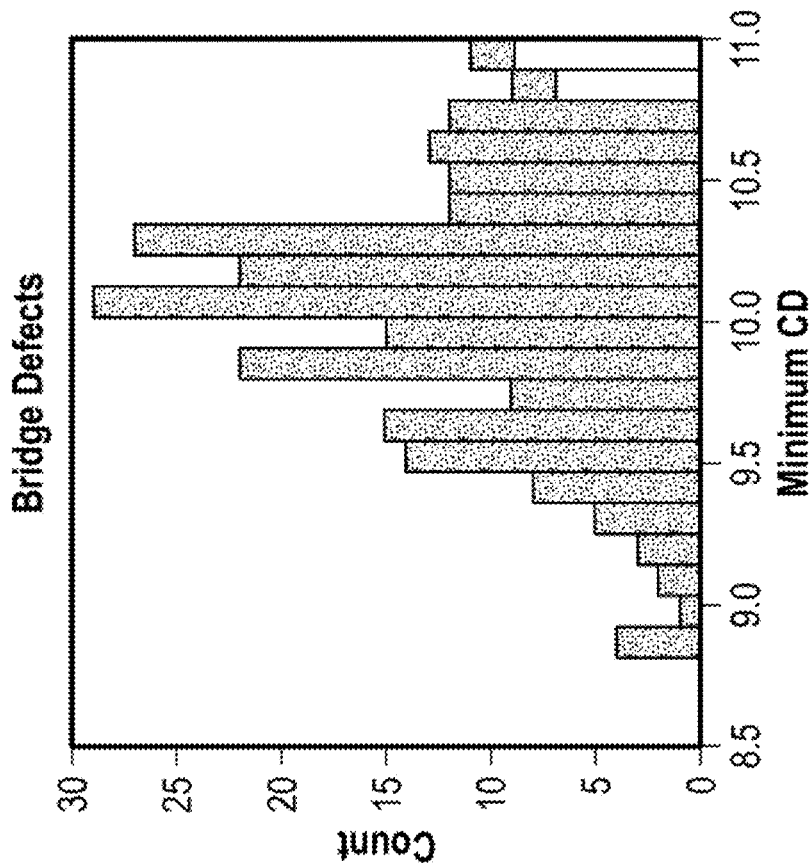
FIG. 9B shows an exemplary histogram of the number of pinch defects as a function of minimum CD obtained using mask data corrected using a conventional OPC model, and an ILT model that accounts for stochastic variations in accordance with embodiments of the present disclosure
Figure 9A:
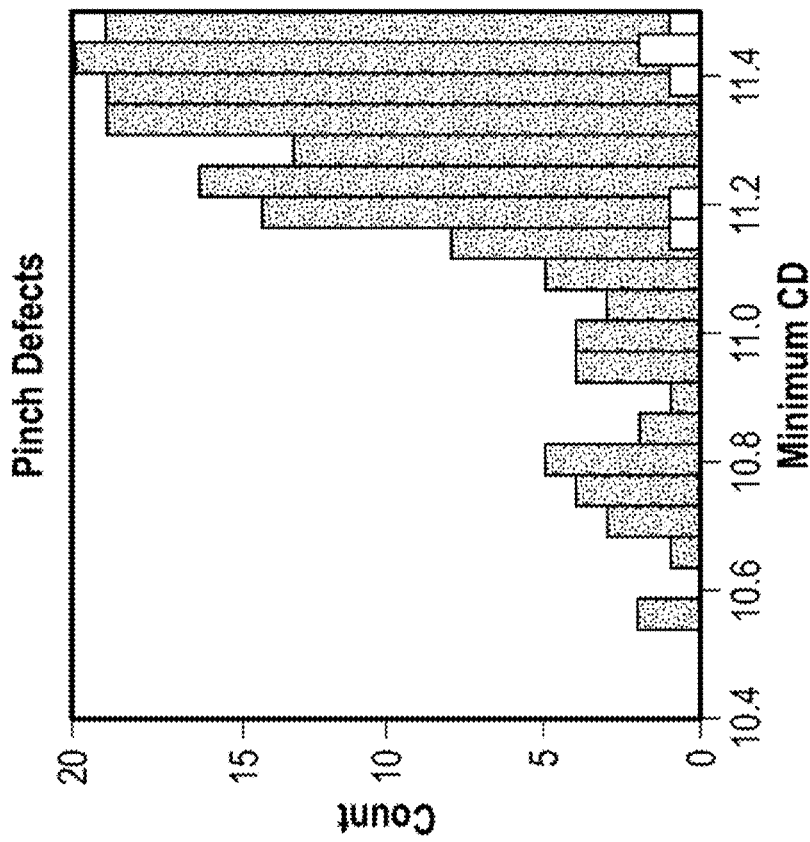
FIG. 9A shows an exemplary histogram of the number of pinch defects as a function of minimum CD obtained using mask data corrected using a conventional OPC model, and an ILT model that accounts for stochastic variations in accordance with embodiments of the present disclosure.

FIG. 9A shows an exemplary histogram of the number of pinch defects as a function of minimum CD obtained using mask data corrected using a (i) conventional OPC model, and (ii) an ILT model that accounts for stochastic variations in accordance with embodiments of the present disclosure. Shaded bars show the pinch defect counts as obtained from a conventional OPC model, and the white bars show the pinch defect counts as obtained from an ILT model that accounts for stochastic variations, in accordance with embodiments of the present disclosure. For the data shown in FIG. 9A, embodiments of the present disclosure achieve a 96.3% reduction in the number of pinch defects relative to a conventional OPC model.

FIG. 9B shows an exemplary histogram of the number of bridge defects as a function of minimum CD obtained using mask data corrected using a (i) conventional OPC model, and (ii) an ILT model that accounts for stochastic variations in accordance with one embodiment of the present disclosure. Shaded bars show the bridge defect counts as obtained from a conventional OPC model, and the white bars show the bridge defect counts as obtained from an ILT model that accounts for stochastic variations in accordance with embodiments of the present disclosure. As seen from FIG. 9B, at minimum CDs of smaller than 10.8 nm, embodiments of the present disclosure result in nearly no bridge defects. For the data shown in FIG. 6B, embodiments of the present disclosure achieve a 93.5% reduction in the number of bridge defects relative to a conventional OPC model.

In accordance with one embodiment of the present disclosure, the defect rate may be determined as a piecewise power series shown in expression (1) below:

$$\log R(CD_{SVB}) = \begin{cases} \beta_{00} + \beta_{10} \cdot CD_{SVB} + \beta_{20} \cdot CD_{SVB}^2 + \ldots & CD_{3\sigma} < CD_{floor} \\ \beta_{01} + \beta_{11} \cdot CD_{SVB} + \beta_{21} \cdot CD_{SVB}^2 + \ldots & CD_{3\sigma} \geq CD_{floor} \end{cases} \quad (1)$$

In expression (1), R represents the defect rate and $CD_{SVB}$ represents the stochastic variance band (SVB) CD. Coefficients $\beta_{00}$, $\beta_{10}$, $\beta_{20}$, $\beta_{01}$, $\beta_{11}$, $\beta_{21}$ . . . may be determined either experimentally or by using a rigorous simulation. Parameter $CD_{floor}$ represents a minimum threshold CD.

The defect rate model shown in expression (1) assumes that bridge and pinch defects may be represented using a continuous and smooth function. The defect rate model be used in both OPC and ILT by adjusting a correction tolerance according to the failure rate. In correcting the stochastic defects, a trade-off exists between pinching and bridging. During the correction for the tolerance, a defect may transition from a pinch to a bridge or vice versa. Because a stochastic failure is strongly CD dependent, in one embodiment, different weights may be applied to the pinch and bridge checks during OPC optimization, as described with reference to flowchart 300 shown in FIG. 6, so that a pinch defect is not converted to a bridge defect, or vice versa. Such conversions can be avoided in ILT optimization by selecting a proper cost functions. Relatively large weights may be used for smaller stochastic CD tolerances to prevent bridging defects, and for larger stochastics CD tolerances to prevent pinching.

Figure 10:
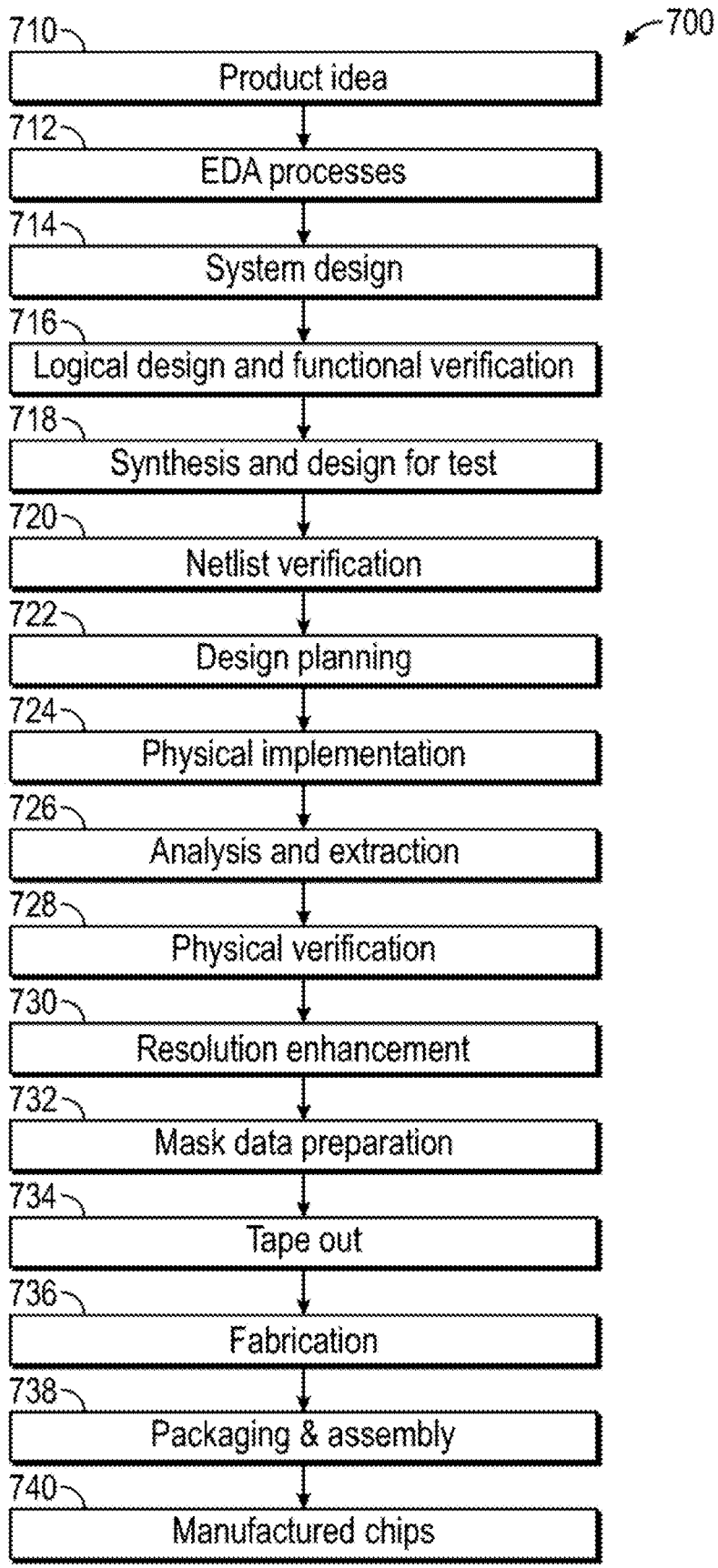
FIG. 10 shows a flowchart of various processes used during the design and manufacture of an integrated circuit, in accordance with some embodiments of the present disclosure.

FIG. 10 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower level representation of a design adds more useful detail into the design description, for example, more details for the modules that include the description. The lower levels representation of a design may be generated by a computer, derived from a design library, or created by another design automation process. An example of a specification language representative of a lower level description of a design is SPICE, which is used for detailed descriptions of circuits with many analog components. Descriptions at each level of representation are enabled for use by the corresponding tools of that layer (e.g., a formal verification tool). A design process may use a sequence depicted in FIG. 10. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 900 of FIG. 11) may be used to store the programs and data structures that are used by some or all of the EDA products described herein, and products used for development of cells for the library and for physical and logical design that use the library.

Figure 11:
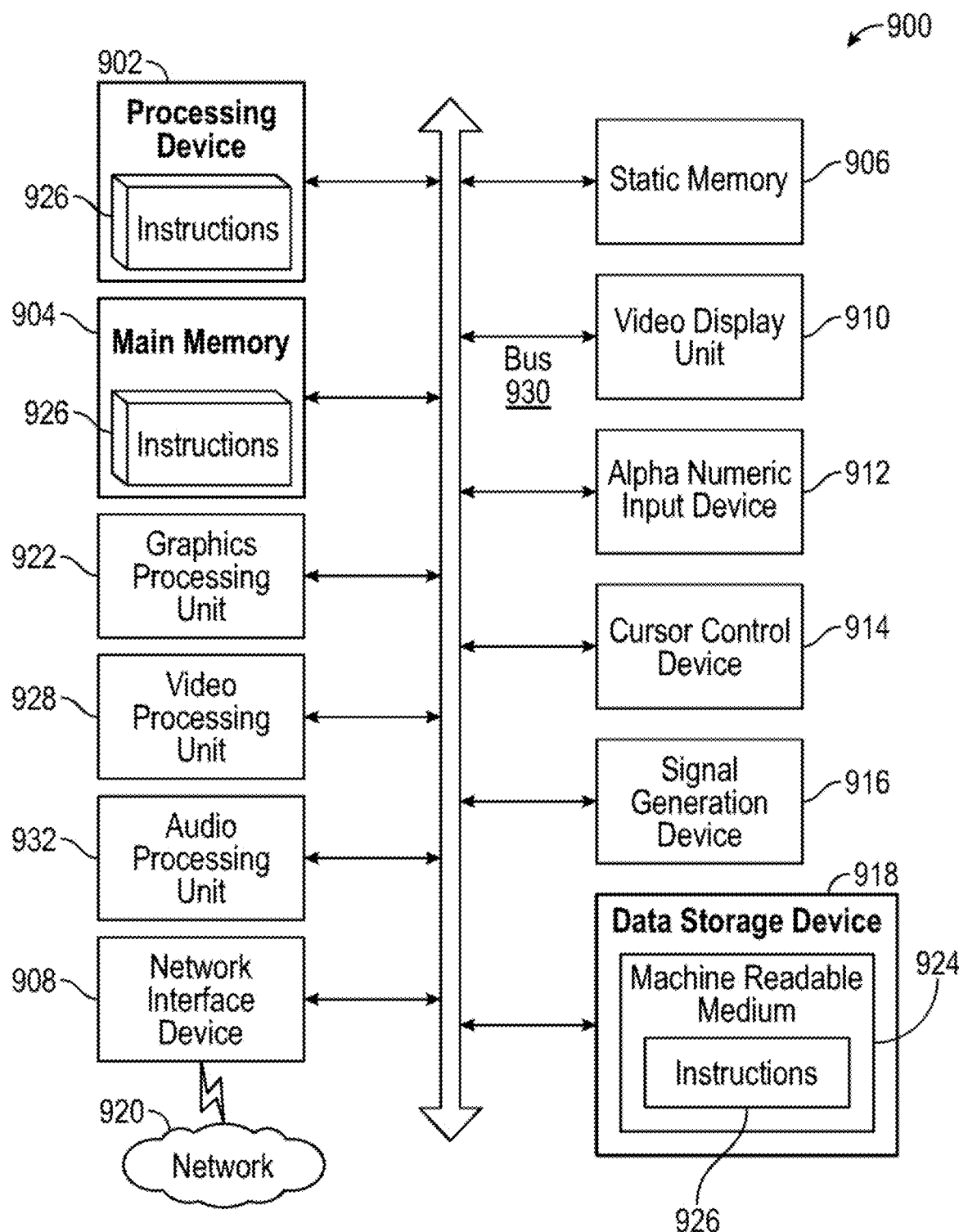
FIG. 11 shows a diagram of an example of a computer system in which embodiments of the present disclosure may operate.

FIG. 11 illustrates an example machine of a computer system 900 within which a set of instructions, for causing the machine to perform any one or more of the methodologies discussed herein, may be executed. In alternative implementations, the machine may be connected (e.g., networked)

to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method of improving mask data used in fabrication of a semiconductor device, the method comprising:
   setting a threshold value associated with a defect based on stochastic failure rate of the defect;
   performing a first optimal proximity correction (OPC) of the mask data using nominal values of mask pattern contours;
   identifying locations within the first OPC mask data where stochastically determined mask pattern contours correspond to a potential defect;
   placing check figures on the identified locations to enable measurement of distances between the stochastically determined mask pattern contours; and
   performing, by a processor, a second OPC of the first OPC mask data so as to cause the measured distances to be greater than the threshold value.

2. The method of claim 1 wherein the defect is selected from bridge and pinch defects.

3. The method of claim 1 wherein the stochastically determined mask pattern contours are defined by three standard deviations away from associated nominal values of the mask pattern contours.

4. The method of claim 1 wherein the mask pattern contours are defined by a Gaussian distribution function.

5. The method of claim 1 wherein the mask data is used to generate a mask adapted for use by an extreme ultraviolet lithography system.

6. The method of claim 1 wherein the stochastic failure rate of the defect is determined using a rigorous simulation model.

7. The method of claim 6 wherein the mask pattern contours are defined by a Gaussian distribution function.

8. The method of claim 6 wherein the mask data is used to generate a mask adapted for use by an extreme ultraviolet lithography system.

9. The method of claim 6 wherein the cost function is a stochastic cost function.

10. A method of improving mask data used in fabrication of a semiconductor device, the method comprising:
    defining a cost function associated with a defect based on stochastic failure rate of the defect;
    performing a first inverse lithography technique (ILT) optimization of the mask data using nominal values of mask pattern contours;
    performing a second ILT optimization of the first ILT optimized mask data using stochastic values of the mask pattern contours until a first value of the cost function is less than or equal to a first target value;
    Manhattanizing the mask pattern contours of the second ILT optimized mask data; and
    Performing, by a processor, a Manhattan optimization of the Manhattanized mask pattern contours until a second value of the cost function is less than or equal to a second target value.

11. The method of claim 10 wherein the defect is selected from bridge and pinch defects.

12. The method of claim 10 wherein the stochastic values of the mask pattern contours are defined by three standard deviations away from associated nominal values of the mask pattern contours.

13. The method of claim 10 wherein the Manhattanized mask pattern contours are defined by angles selected from 0 and 90 degrees.

14. A non-transitory computer readable storage medium comprising instructions which when executed by a processor cause the processor to:
    set a threshold value associated with a defect based on stochastic failure rate of the defect;
    perform a first optimal proximity correction (OPC) of the mask data using nominal values of mask pattern contours;
    identify locations within the first OPC mask data where stochastically determined mask pattern contours may lead to the defect;
    place check figures on the identified locations to enable measurement of distances between the stochastically determined mask pattern contours; and
    perform a second OPC of the first OPC mask data so as to cause the measured distances to be greater than the threshold value.

15. The non-transitory computer readable storage medium of claim 14 wherein the defect is selected from bridge and pinch defects.

16. The non-transitory computer readable storage medium of claim 14 wherein the stochastically determined mask pattern contours are defined by three standard deviations away from associated nominal values of the mask pattern contours.

17. The non-transitory computer readable storage medium of claim 14 wherein the Manhattanized mask pattern contours are defined by angles selected from 0 and 90 degrees.

18. The non-transitory computer readable storage medium of claim 14 wherein the mask pattern contours are defined by a Gaussian distribution function.

19. The non-transitory computer readable storage medium of claim 14 wherein the mask data is used to generate a mask adapted for use by an extreme ultraviolet lithography system.

20. The non-transitory computer readable storage medium of claim 14 wherein the cost function is a stochastic cost function.

* * * * *